United States Patent
Haandbaek et al.

(10) Patent No.: US 10,788,534 B2
(45) Date of Patent: Sep. 29, 2020

(54) DEVICE FOR DYNAMIC SIGNAL GENERATION AND ANALYSIS

(71) Applicant: ZURICH INSTRUMENTS AG, Zürich (CH)

(72) Inventors: Niels Haandbaek, Zug (CH); Flavio Heer, Lufingen (CH); Stephan Koch, Langnau am Albis (CH); Sadik Hafizovic, Zürich (CH)

(73) Assignee: ZURICH INSTRUMENTS AG (CH)

( * ) Notice: Subject to any disclaimer, the term of this patent is extended or adjusted under 35 U.S.C. 154(b) by 118 days.

(21) Appl. No.: 16/060,524

(22) PCT Filed: Dec. 18, 2015

(86) PCT No.: PCT/CH2015/000189
§ 371 (c)(1),
(2) Date: Jun. 8, 2018

(87) PCT Pub. No.: WO2017/100953
PCT Pub. Date: Jun. 22, 2017

(65) Prior Publication Data
US 2018/0356465 A1  Dec. 13, 2018

(51) Int. Cl.
*G01R 31/28* (2006.01)
*G01R 31/319* (2006.01)
*G01R 15/12* (2006.01)

(52) U.S. Cl.
CPC ....... *G01R 31/31903* (2013.01); *G01R 15/12* (2013.01)

(58) Field of Classification Search
CPC .......................... G01R 15/12; G01R 31/2806; G01R 31/2831; G01R 31/2884; G01R 31/2886; G01R 31/2889; G01R 31/31903; G01R 31/31905; G01R 31/31917; G01R 31/31926; G01R 35/00
See application file for complete search history.

(56) References Cited

U.S. PATENT DOCUMENTS

| | | | |
|---|---|---|---|
| 5,011,660 A | 4/1991 | Arena | 422/22 |
| 6,400,173 B1 | 6/2002 | Shimizu et al. | 324/765 |
| 7,340,357 B2 | 3/2008 | Ammerman | 702/66 |

(Continued)

OTHER PUBLICATIONS

International Search Report dated Sep. 13, 2016 in corresponding PCT International Application No. PCT/CH2015/000189.
(Continued)

*Primary Examiner* — Alesa Allgood
(74) *Attorney, Agent, or Firm* — Ostrolenk Faber LLP (57) ABSTRACT

A device for dynamic signal generation and analysis, which combines an arbitrary waveform generator AWG (3) with a digital signal analysis unit DSAU (23). The two units are interfaced by means of a synchronization unit SU (30), which enables a flexible scheme for controlling how the playback of the waveforms is started as well as synchronizing the recording of the results of the digital signal analysis unit synchronously to specific generated waveforms. The various units of the device are synchronous circuits clocked by a common system clock signal. At least one common numerically controlled oscillator NCO (40) is provided for the arbitrary waveform generator AWG (3) and the digital signal analysis unit DSAU (23).

21 Claims, 5 Drawing Sheets

(56) References Cited

U.S. PATENT DOCUMENTS

| | | |
|---|---|---|
| 9,100,030 B1 | 8/2015 | Haisch |
| 2002/0170006 A1* | 11/2002 | Schaber ........... G01R 31/31727 714/724 |
| 2006/0273809 A1* | 12/2006 | Miller ................ G01R 31/2889 324/750.05 |
| 2007/0067123 A1 | 3/2007 | Jungerman ..................... 702/67 |
| 2012/0313697 A1 | 12/2012 | Hafizovic ..................... 329/323 |
| 2014/0218103 A1 | 8/2014 | Hafizovic |
| 2016/0132202 A1 | 5/2016 | Hafizovic |

OTHER PUBLICATIONS

Written Opinion dated Sep. 13, 2016 in corresponding PCT International Application No. PCT/CH2015/000189.

\* cited by examiner (prior art)

DEVICE FOR DYNAMIC SIGNAL GENERATION AND ANALYSIS

CROSS-REFERENCE TO RELATED APPLICATIONS

The present application is a 35 U.S.C. §§ 371 national phase conversion of PCT/CH2015/000189, filed Dec. 18, 2015, the content of which is incorporated herein by reference. The PCT International Application was published in the English language.

TECHNICAL FIELD

The present invention relates to a device for generating a probe signal and for analyzing a response to said probe signal.

BACKGROUND ART

In numerous scientific and industrial applications, there is a need for measuring electrical signals in response to a probe signal. The quality of the signal generation as well as the signal recording and subsequent analysis are of great importance to retrieve the signal of interest with the best quality. In real-world signals, the signal-to-noise ratio can be poor. Many strategies have been devised to improve the signal-to-noise ratio, including repeated measurements and averaging, time synchronization or analog and digital signal processing.

To generate a stimulus signal, often an arbitrary waveform generator or other type of signal generator is employed. Arbitrary waveform generators (AWG) are mainly used in applications where there is a need for generating arbitrary electrical waveforms with precisely defined timing in order to stimulate a unit under test (UUT). For example, AWGs are used in the field of test and measurement to simulate a real life situation for testing a device, such as a cellular telephone. In this case, the AWG could be used for generating a wireless communication signal.

Figure 1:
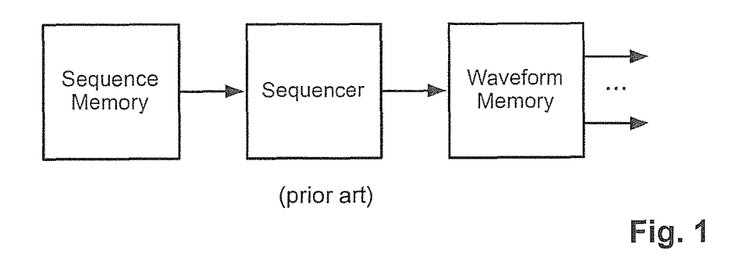
FIG. 1 is a block diagram of the internal architecture of an AWG according to the prior art.

FIG. 1 shows a block diagram view of part of an AWG according to the prior art. A plurality of waveforms are stored in a waveform memory. Each waveform is stored as an ordered list of digital samples. Selected waveforms are read from the waveform memory using a sequencer. The selection of which waveforms to output are controlled by the sequencer program stored in the sequencer memory. The sequencer is typically capable of playing the same waveform multiple times in sequence, as well as playing different waveforms after each other.

The signal from the AWG is sent through the UUT. A response signal from the UUT is then recorded. The recorded signal is often covered by noise, or it suffers from disturbances, such as interfering signals. Signal conditioning techniques such as, e.g., lock-in amplification, boxcar averaging, or filtering are often employed to recover the signal of interest. The details of the analysis operations are highly dependent on the particular application. The analysis may be as simple as digitizing the response of the UUT and storing the result. For other applications, such as nuclear magnetic resonance measurements, it may be necessary to measure the amplitude or the phase of the signal input at a specific frequency. In such cases, the signal analysis may take the form of a multistage process, where the signal input is first multiplied with a carrier waveform and subsequently filtered in order to increase the signal to noise ratio of the result.

In many applications, it is necessary to measure the response of the UUT at precise points in time in relation to when a specific waveform is output by the AWG. AWG and signal analysis operations are implemented in different instruments. The information about when to record signal analysis results must be communicated between said instruments using a signal transmitted over a cable. Due to the need for transmitting the information at highly precise time points, such systems typically make use of coaxial cables, which complicates the transmission of multi-bit messages between instruments.

As can be seen, devices of this type tend to be complex, especially when high-speed signals are to be generated and the response signals are to be measured with high accuracy.

DISCLOSURE OF THE INVENTION

Hence, the problem to be solved by the present invention is to provide a device for generating a probe signal and for analyzing a response to said probe signal that is of simple design and yet versatile and that allows reliable measurements with high accuracy.

This problem is solved by the device of claim 1.

Accordingly, the device comprises the following components:

A digital arbitrary waveform generator AWG (in the following called AWG) having at least one signal output. The AWG is responsive to AWG control signals and adapted to generate a probe signal depending on said control signals.

A digital signal analysis unit DSAU (in the following called DSAU) having a signal input for receiving said response signal. The DSAU is responsive to DSAU control signals and adapted to analyze the response signal and to derive measured data from said analysis in a manner dependent on said DSAU control signals.

A reconfigurable synchronization unit SU (in the following called SU) receiving, in real-time, AWG state information from said AWG and DSAU state information from said DSAU and having a programmable configuration. The SU is adapted to generate, in real-time, said AWG control signals and said DSAU control signals as a function of said AWG state information, said DSAU state information and said configuration. The SU is reconfigurable in the sense that its configuration can be changed by programming.

In the present invention, the SU is structured and adapted to receive state information from both the AWG and the DSAU. It has a programmable configuration and, depending on that configuration, it will generate the DSAU and AWG control signals, each of which control at least part of the operation of the DSAU and the AWG, respectively.

In conventional systems, synchronization between AWG and DSAU (which are in separate devices) is restricted to simple cables carrying one-bit information, such that synchronization is inflexible and difficult to reconfigure. In contrast to this, the present invention provides a versatile device that allows a rich and configurable interaction between AWG and DSAU. The interaction between the AWG and the DSAU can be configured by the user by suitable programming of the configuration of the SU.

Advantageously, the device comprises a common system clock generator that clocks the AWG, DSAU and SU. Such a device does not suffer from trigger jitter. Conventional digital systems that do not share the same system clock are subject to trigger jitter. A trigger that is sent from one system to the other needs to be re-sampled. This re-sampling suffers from jitter, which leads to a time uncertainty added to the trigger signal.

In particular, at least the AWG, DSAU and SU are synchronous circuits clocked by the common clock generator.

In another advantageous embodiment, the device comprises at least one common numerically controlled oscillator (NCO) for the AWG and the DSAU. Such an NCO can provide a precise phase information to the different systems, which translates into a very high temporal resolution that can be even significantly below the system clock interval. Again, the NCO is advantageously also a synchronous circuit clocked by the common clock generator mentioned above.

In yet another advantageous embodiment, the device comprises at least one output generation unit (OGU) for digitally post-processing a signal generated in the AWG. It generates the output signal of the system and is programmable to optionally combine the signal generated in said AWG with at least one further value using a plurality of different operations. The combination can be a mathematical function of the signal generated in the AWG and said further value. The mathematical function implemented by the OGU can be selected as one of or a combination of arithmetic, Boolean and time-shift operations.

Said further value processed by the OGU is advantageously a value generated by the AWG and/or by the NCO.

BRIEF DESCRIPTION OF THE DRAWINGS

The invention will be better understood and objects other than those set forth above will become apparent when consideration is given to the following detailed description thereof. This description makes reference to the annexed drawings, wherein.

MODES FOR CARRYING OUT THE INVENTION

Definitions

In the present context, a "digital arbitrary waveform generator" (AWG) is a unit capable of generating arbitrary waveforms (within a certain frequency range) at its signal output. The waveforms are generated digitally to be converted to an analog signal.

A "digital signal analysis unit" (DSAU) is a digitally implemented unit capable of deriving one or more characteristic values from a digitized input signal.

The term "real-time" expresses the process of analyzing or generating signals in a manner where the latency of the process is deterministic and in most cases known beforehand.

A numerically controlled oscillator (NCO) is a digital signal generator that generates a discrete-time, discrete-valued representation of a repetitive signal. Typically, an NCO comprises at least a phase accumulator generating repetitive, linearly increasing phase values between 0 and N, with 0 corresponding to a phase shift of zero and N>2 being an integer corresponding to a phase shift $2\pi \cdot N/(N+1)$. The phase values can then be converted e.g. to a sinusoidal (or other) signal using a lookup-table.

A "synchronous circuit" is a digital circuit in which state changes of memory elements are synchronized by a common clock.

A "synchronous circuit with a non-von-Neumann-architecture" is a synchronous circuit not using a classic von-Neumann-architecture, in particular a circuit without a sequential instruction execution flow. This type of circuit is well suited for fast, synchronous signal processing, and it is often implemented using FPGA or ASIC technologies.

Figure 2:
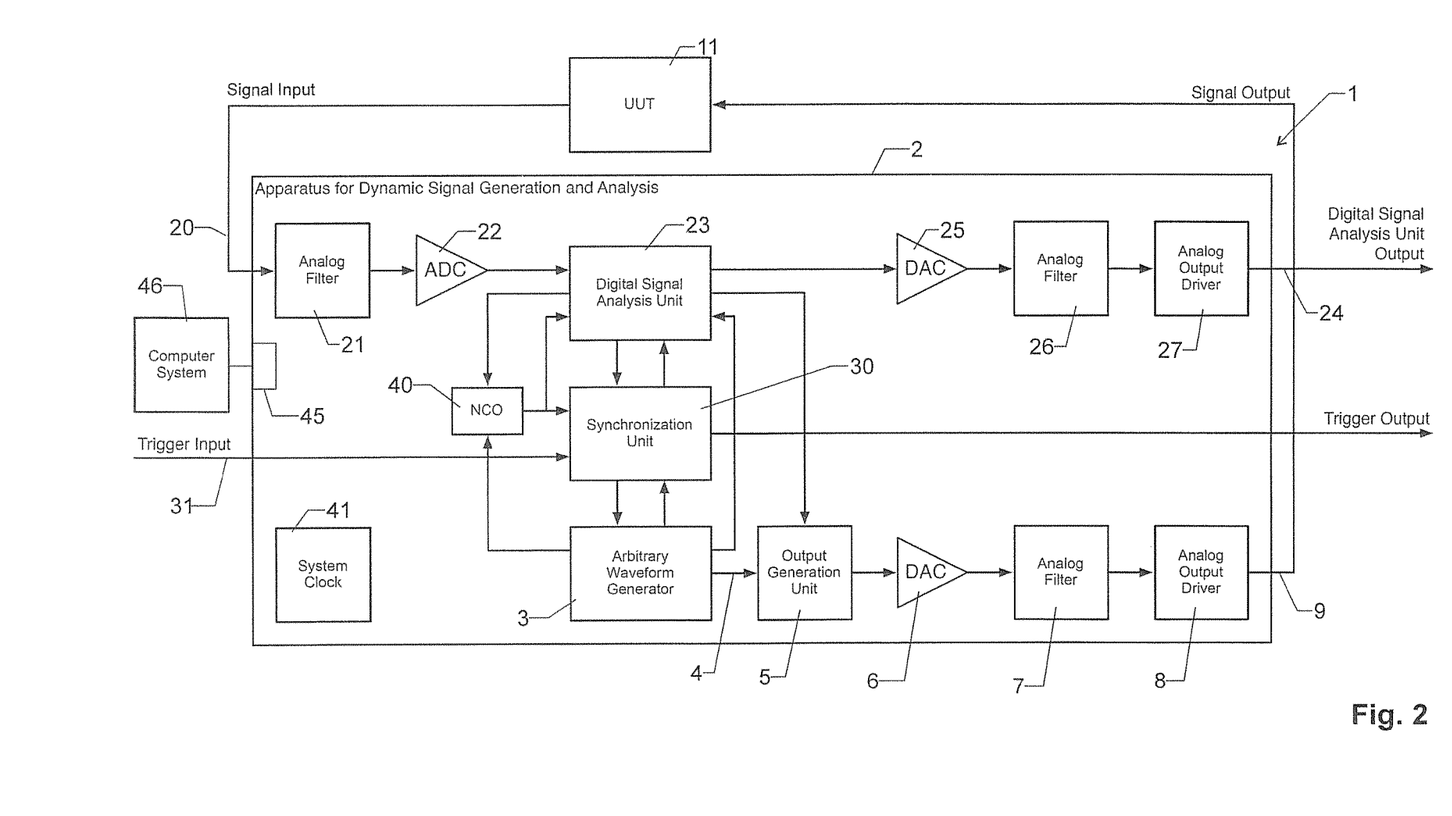
FIG. 2 is a block diagram view of a device with an attached unit under test (UUT) and an external control computer.

Overview:

FIG. 2 is a block diagram of a complete setup with an instrument including arbitrary waveform generation, digital signal analysis, output generation, and synchronization.

The instrument, which is in the following called the "device 1", of FIG. 2 comprises an AWG 3, which generates an arbitrary waveform at a point 4. This signal is fed to an OGU 5. The output of the OGU 5 is fed to a digital-to-analog converter 6, whose analog output signal can be filtered in an analog filter 7 in order to limit the bandwidth of the signal in accordance with the Nyquist criterion. An analog output driver 8 can be provided for amplifying the current and/or voltage of the analog signal, thereby allowing the instrument to drive loads with various impedance properties.

The signal generated in this manner is applied to an output 9 of device 1. It is typically fed to a unit under test (UUT), which in turn generates a response signal. The response signal is fed to a signal input 20 of device 1.

The signal from signal input 20 can again be filtered by an analog filter 21 and is then digitized and converted to a series of numerical values by means of an analog-to-digital converter 22. These values are fed to a DSAU 23.

DSAU 23 can optionally comprise one or more analog outputs 24 comprising a digital-to-analog converter 25, and, if required, an analog filter 26 and an analog output driver 27.

The device may optionally include a connection from AWG 3 to DSAU 23. The connection may be used by the AWG for transmitting operating parameters and additional information to DSAU 23. The operating parameters could, for example, be delay or integration time for a boxcar formed by DSAU 23.

A synchronization unit (SU) 30 synchronizes AWG 3 and DSAU 23. SU 30 can comprise one or more trigger inputs 31 and/or one or more trigger outputs 32.

One or more numerically controlled oscillators (NCO) 40 generate a multi-valued repetitive signal that can be used by AWG 3 and DSAU 23, as well as by other components of the device, as described in more detail below. The connection from AWG 3 to NCO 4 enables the AWG to optionally control the repetition rate of the signal generated by the NCO.

A common system clock generator 41 can provide a common (binary) clock signal to the various components of device 1.

Device 1 further comprises a control interface 45 for being connected to an external computer system 46 in order to allow a user or a controlling system to program the configuration of the various components of device 1.

Device 1 comprises common housing 2 that encloses at least AWG 3, DSAU 23, NCO 40, OGU 5 and clock generator 41. Advantageously, it also encloses the other components shown within the respective rectangle of FIG. 2.

Clock generator 41 synchronously clocks at least AWG 3, DSAU 23, SU 30, NCO 41, OGU 5, and advantageously also ADC 22 and the DACs 6 and 25. As mentioned above, using commonly clocked units avoids trigger jitter between them.

In order to achieve good synchronization, at least AWG 3, DSAU 23, SU 30, NCO 41 and OGU 5 are implemented as synchronous circuits. Advantageously, they are "synchronous circuits with a non-von-Neumann-architecture" (as defined above). In a simple embodiment, they can be implemented as one or more FPGA or ASIC circuits.

Figure 3:
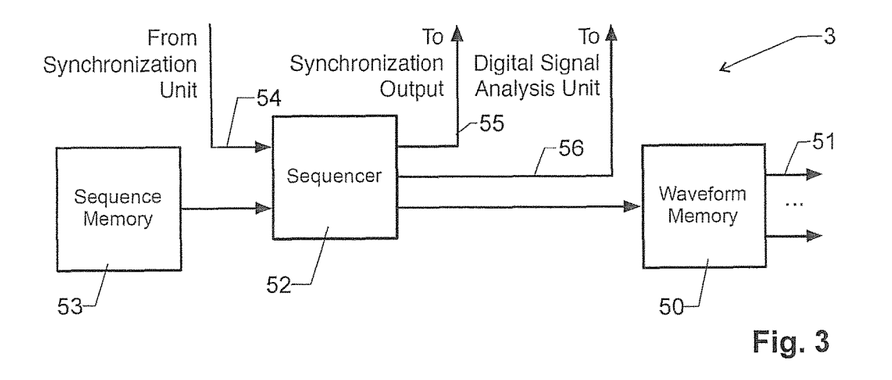
FIG. 3 is a partial block diagram of an embodiment of an AWG.

AWG:

FIG. 3 shows an embodiment of AWG 3. It comprises a waveform memory 50 holding a plurality of waveforms, each as an ordered list of digital samples. Waveform memory 50 comprises at least one waveform memory output 51 for sequentially outputting the digital samples of a currently selected waveform.

A sequencer 52 is adapted to selecting any waveform in waveform memory 50. Sequencer 52 is programmable by values stored in a sequence memory 53. Further, it comprises at least one control input 54 for AWG control signals from SU 3. In the present embodiment, it also comprises at least one synchronization output 55 for sending AWG state information to SU 30 and/or at least one information output 56 for sending single-bit or multibit data values to DSAU 23.

For example, sequence memory 53 can comprise a series of statements, such as
1. Start playing waveform X from waveform memory
2. Wait until a given AWG control signal becomes 0
3. Start playing another waveform Y from waveform memory
4. Wait a given time
5. Go back to step 1

Executing these statements allows a series of signals to be generated the order of which depends on the AWG control signals.

Hence, in more general terms, sequencer 52 is adapted to define a waveform to be generated. It is programmable in a conditional manner as a function of the AWG control signals received through control input 54. In this context, "programmable in conditional manner" expresses that the programming instructions fed to sequencer 52 can comprise conditional statements that test the values of the control signals.

Further, sequencer 52 can also be adapted to process commands to change the values at synchronization output 55 and/or information output 56. For example, a series of statements could e.g. read as follows
1. Set the value at a given synchronization output to 0
2. Set the value at information output to 33
3. Start playing waveform X from waveform memory
4. Wait a given time A
5. Set the value at a given synchronization output to 1
6. Set the value at information output to 5
7. Start playing another waveform Y from waveform memory
8. Wait a given time B
9. Go back to step 1

Executing these statements allows other parts of the device to be synchronized to the operation of the sequencer. In particular, trigger signals can be sent through the synchronization output(s) to SU 30, and/or information to be stored with measured values can be sent through the information output(s) to DSAU 23.

In more general terms, sequencer 52 is adapted to programmatically set said synchronization output 55 for DSAU state information to be sent to SU 30, and/or it can be structured and adapted to programmatically set a value at information output 56.

DSAU:

DSAU 23 is, as mentioned, adapted to analyze the response signal received at signal input 20. Parameters of the analyzing algorithm can be controlled by means of the DSAU control signals received from SU 30.

DSAU 23 further typically comprises a memory for storing parameters derived from analyzing the response signal, and it comprises synchronization outputs to be sent to SU 30 (e.g. containing information about the phase and amplitude of the response signal) and/or an information output to be sent to OGU 5 (e.g. containing the current sine value of NCO 40).

In practice, the algorithm run by DSAU 23 depends on the desired form of signal analysis. Device 1 can be provided with several different, user-selectable DSAU algorithms (e.g. selectable directly through interface 45 and/or by means of dedicated statements executed by sequencer 52), or different DSAU algorithms can e.g. be provided as replaceable hardware modules to be swapped manually.

Examples of important algorithms that can be implemented by DSAU 23, alone or in combination of any subset, are
- lock-in amplification
- boxcar averaging
- PID control (i.e. the difference between the response signal and a reference signal, as well as the integral and/or the derivative of said difference, are used (in particular by linear combination) for calculating an output value, which can e.g. be a control value of a feedback loop that strives to keep the response signal at said reference value
- spectrum analysis
- phase-locked loop
- digitization (i.e. recording the response value as a time-series of signal values)
- digital filtering
- convolution or correlation of the response signal with itself or another signal (such as with a signal generated in AWG 3 or with a predefined signal)

In general terms, DSAU 23 is adapted to process the response signal with an algorithm, where the algorithm is parameterized by the DSAU control signals it receives from SU 30.

Figure 4:
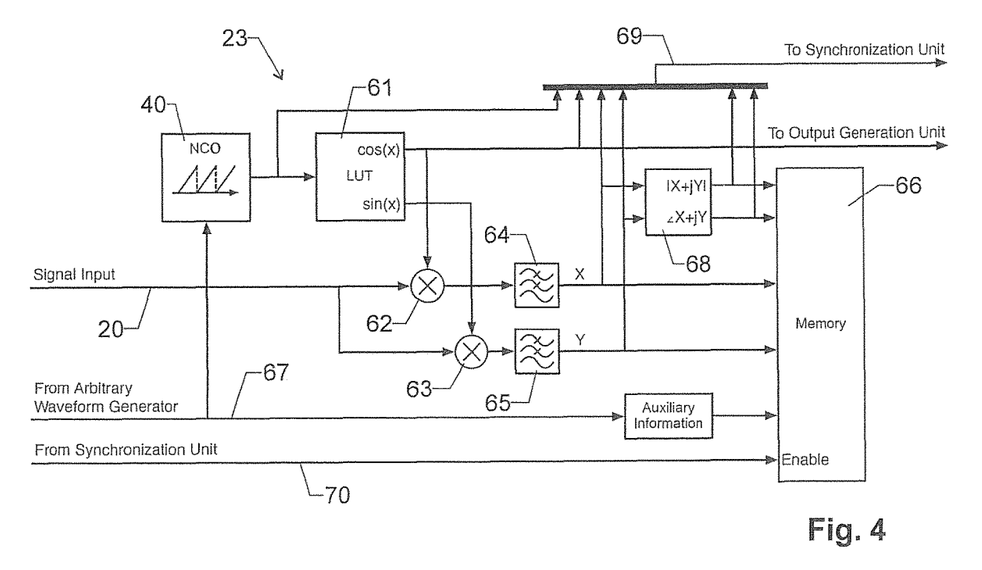
FIG. 4 is a block diagram of an embodiment of a DSAU.

FIG. 4 shows an embodiment of DSAU 23 designed as a lock-in amplifier. It comprises a phase synchronous process (PSP) that is synchronous with NCO 40. The phase values generated by NCO 40 are fed to a lookup table 61 for generating a sine and a cosine signal. These sine and cosine signals are fed to multipliers 62, 63, where they are multiplied with the response signal at signal input 20. The multiplied values are filtered in digital low-pass filters 64, 65 and stored in a DSAU memory 66. In this way, the real and imaginary parts X and Y of the complex-valued amplitude and phase of the response signal with respect to the NCO signal can be measured in a basically known manner.

As can further be seen from FIG. 4, the data from information output 56 of AWG 3 is received by DSAU at an information input 67 and it is stored, in DSAU memory 66, together with each recorded data value from the lock-in amplifier.

Hence, in more general terms, and irrespective of the algorithm implemented by DSAU 23, DSAU 23 is adapted and structured to store the multibit information values received through information output 56 of AWG 3 together with the measured data it records, i.e. in such a manner that each recorded data is tagged with the information value received from AWG 3 at the same time. This simplifies later analysis of the recorded data.

Turning back to the example of FIG. 4, DSAU 23 further comprises a unit 68 for calculating the amplitude and phase of the real and imaginary parts X and Y. DSAU 23 records these values in DSAU memory 66, again tagged with the information value received from AWG 3.

In addition, some or all of the recorded values are sent in real-time to SU 30 as AWG state information by means of a multibit DSAU synchronization output 69.

Hence, again in general terms, and irrespective of the analysis it performs, DSAU 23 comprises a synchronization output 69 for sending at least some of the measured data as DSAU state information to SU 30.

Further, and as shown for the embodiment of FIG. 4 (even though applicable to any other type of analysis), DSAU 23 can comprise a storage enable input 70 that enables the storage into DSAU memory 66. Data storage only takes place when SU 30 enables storage by means of storage enable input 70, which can e.g. be used to store only the relevant data in memory, thereby reducing memory consumption.

Figure 5:
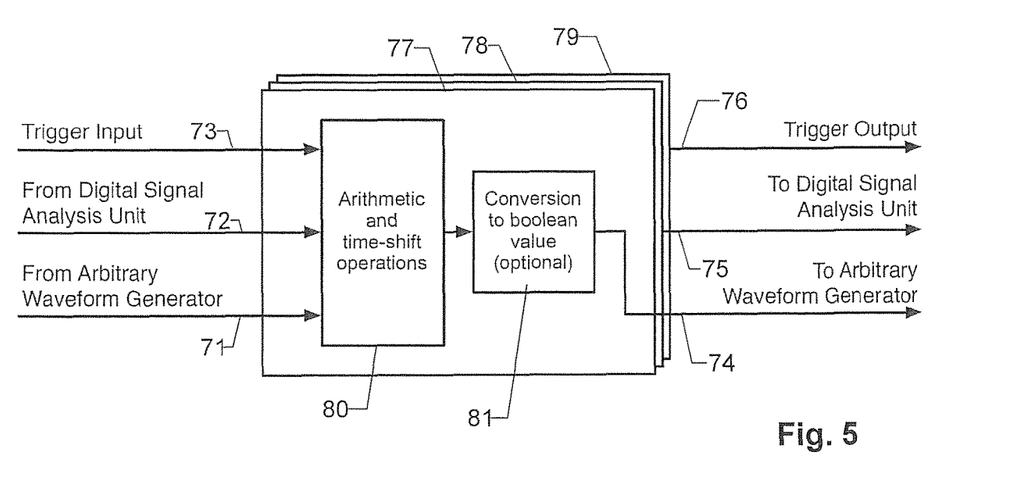
FIG. 5 is a block diagram of an embodiment of the SU.

SU:

FIG. 5 shows an example of SU (synchronization unit) 30.

In the present embodiment, SU 30 has the following inputs:

An AWG state input 71 receives the AWG state information. The AWG state information received at AWG state input 71 can comprise single-bit or multi-bit signals. One example of an AWG state information is the single-bit "memory enable" signal that enables the storage of signals in DSAU memory 66, as described above. Sequencer 52 allows the user to set the state information as part of the sequencer's programming code, and these values may be forwarded through SU 30 to DSAU 23.

A DSAU state input 72 that receives the DSAU state information. The DSAU state information can e.g. be any of the signals from the DSAU's synchronization output 69, such as the phase and amplitude or real and imaginary values of a measured signal) and again comprises single-bit or multi-bit signals.

At least one trigger input 73 that receives an external trigger signal. The signal at trigger input 73 is, in contrast to the signals at the other inputs of SU 30, often asynchronous. It is typically single-bit but can also be a multi-bit signal.

Further, SU 30 comprises the following outputs:

An AWG control output 74 that sends the AWG control signals to AWG 3. These are the signals applied to control input 54 of AWG 3.

A DSAU control output 75 that sends the DSAU control signals to DSAU 23. These comprise, for example, the signal to be applied to storage enable input 70 of DSAU 23.

At least one trigger output 76 that sends signals to external circuitry.

Further, SU 30 comprises three synchronization modules:

An AWG synchronization module 77 generates the AWG control signals at AWG control output 74 from the signals present at AWG state input 71, DSAU state input 72 as well as trigger input 73.

A DSAU synchronization module 78 generates the DSAU control signals at DSAU control output 75 from the signals present at AWG state input 71, DSAU state input 72 as well as trigger input 7.

A trigger synchronization module 79 generates the signals at trigger output 74 from the signals present at AWG state input 71, DSAU state input 72 as well as trigger input 73.

Trigger input 73, trigger output 76 and trigger synchronization module 79 are optional, but they are advantageous if the present device is to cooperate with external signal sources and/or signal receivers.

In the present embodiment, the three synchronization modules 77, 78, 79 are of basically identical design, such as shown for AWG synchronization module 77 in FIG. 5.

In particular, each synchronization unit 77, 78, 79 comprises a processing block 80 for performing arithmetic and time-shift operations on each of the inputs 71, 72, 73, as well as (optionally) a converter 81 for converting the processed results from block 80 to Boolean (binary) values.

The operation(s) to be carried out by processing block 80 as well as by converter 81 can be configured by the user through interface 45.

In particular, each synchronization module 77, 78, 79 provides the following user-selectable operations:

Forward an input signal to an output without processing. This is e.g. often a useful operation for the memory enable signal received from AWG 3 and to be forwarded to DSAU 23.

Compare a multi-bit input value to a threshold, and e.g. set an output to 1 if the threshold is exceeded, otherwise to 0.

Combine multiple inputs e.g. by addition, subtraction, multiplication, division or binary logical operations (not/and/or/xor).

Carry out any of the above operations not only on the current input values but also on time-shifted versions thereof. For this purpose, each input value can be fed to a shift register, which is clocked by the system clock. This makes it possible e.g. to implement calculations for rolling means or filtering.

In more general terms, SU 30 is adapted to generate the AWG and DSAU control signals (and, optionally, the trigger output signal(s)) from the AWG state information, DSAU state information (and, optionally, the trigger input signal(s)) in a programmable manner. In particular, SU 30 is configured to generate the control signals from the state information by programmatically applying at least several of the following operations: arithmetic operations, logical operations, time shifting operations, threshold comparisons.

In addition to the above, if NCO 40 is not considered to be part of DSAU 23, SU 30 can also be adapted to send control signals to NCO 40, in particular derived from state information provided by AWG 3.

OGU:

As mentioned, the device further comprises OGU (output generation unit) 5 for digitally post-processing the signal generated in AWG 3 by waveform memory 50 of AWG 3. OGU 5 is considered to form, functionally, part of AWG 3, even though it is represented in FIG. 2 as a separate unit.

OGU 5 is programmable and adapted to optionally combine the output signal from AWG 3 with a "further value" using a plurality of different operations.

In particular, the "further value" is a signal from DSAU 23 and/or NCO 40, i.e. OGU 5 can enable a flexible mechanism for generating the actual output signal of the instrument as a combination between the signal generated in AWG 3 and a signal from DSAU 23 and/or from NCO 40.

Figure 6:
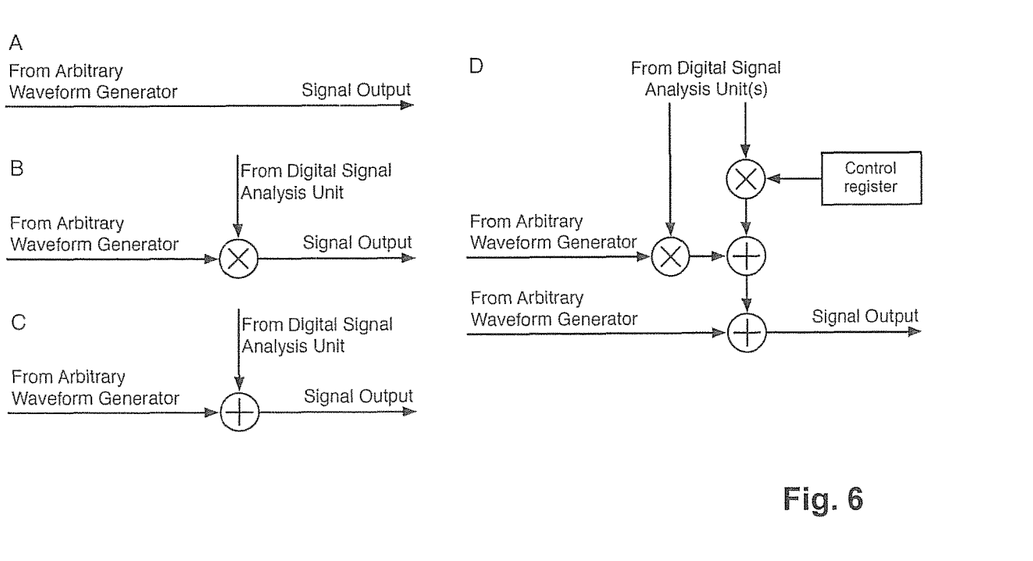
FIG. 6 illustrates four possible configurations of the OGU.

A number of operations that can be programmatically selected in OGU 5 is illustrated by FIG. 6:

In option A, OGU 5 is programmed to directly forward the signal generated in AWG 3 to its output.

In option B, OGU 5 is programmed to multiply the signal generated in AWG 3 with a signal from DSAU 23 and/or NCO 40.

In option C, OGU 5 is programmed to add the signal generated in AWG 3 to a signal from DSAU 23 and/or NCO 40.

In option D, OGU 5 is programmed to generate the signal output as a combination of the above methods and by further multiplying one of the further values with a fixed number stored in a control register. In this embodiment, two different waveforms generated in AWG 3 are combined in OGU 5.

Combining a signal generated in AWG 3 with a signal from NCO 40 is particularly advantageous. For example, by using a multiplication (option B), the signal from NCO 40 can be used as a carrier signal, and the signal generated in AWG 3 can be used to modulate that carrier signal. Similarly, by using an addition (option C), the carrier signal can be provided with an offset generated by AWG 3.

The signal from the NCO 40 fed to OGU 5 is advantageously a sine or cosine value calculated from the NCO's phase signal.

The "further value" (which may, in fact, comprise several values from different sources, as in option D of FIG. 6) can also come from SU 30.

NCO:

As mentioned, the device comprises one or more numerically controlled oscillators NCO 40.

NCO 40 can either be integrated as a part of DSAU 23 or as a separate unit outside of DSAU 23. It can also be integrated into another component of the device, such as AWG 3 or OGU 5.

NCO 40 can be connected to a process (PSP) of DSAU 23 that is phase synchronous with NCO 40. The phase-synchronous process (PSP) analyzes the input signal at the frequency of NCO 40. Examples for a PSP are lock-in amplification, digital boxcar averaging or phase-locked loop operation.

SU 30 may also receive the phase information form NCO 40. This allows for triggering AWG 3 periodically at a time point that is defined by the numerical oscillator, i.e. at a fixed phase within the phase signal generated by NCO 40.

DSAU 23 and AWG 3 work at the same period as defined by NCO 40. In particular, and as mentioned, the NCO signal can be connected to OGU 5. This enables direct digital up-conversion of the AWG output signal to a reference frequency given by NCO 40.

The frequency of NCO 40 is advantageously set by means of sequencer 52, i.e. sequencer 52 defines a dedicated command (which can be stored in sequencer memory 53) that allows a user to set the NCO's frequency.

Similarly, sequencer 52 can advantageously also define the phase of NCO 40, e.g. provide a numerical value to be added to the NCO's phase output value, which defines a phase offset. Again, sequencer 52 defines a dedicated command that allows a user to set the NCO's phase offset.

The frequency of NCO 49 can also be defined by an external reference. For example, NCO 40 can be part of a digital phase-locked loop, which allows the tracking of said external reference frequency. In the simplest case, the external reference comes from a reference clock source.

The system may also be in closed loop, and the external reference frequency can be generated by a physical phenomenon in UUT 11. The reference frequency could, for example, be defined by the resonance frequency of a mechanical oscillator or the repetition rate of a pulsed laser driving an optical experiment. In such a case, AWG 3 produces a periodic stimulus signal at the repetition rate given by NCO 40. The NCO frequency/period itself is adjusted by a control loop, e.g. implemented in DSAU 23, such that UUT 11 is kept in a resonance condition.

Device Control:

As mentioned, the device comprises a control interface 45 that allows an external computer system 46 to control its operation. In particular, control interface 45 is adapted to program the operation of sequencer 52 by accessing sequence memory 53, configure how SU 30 converts its various input values to its output values, configure how DSAU 23 processes the signal it receives, and configure how OGU 5 processes the signal generated in AWG 3.

In addition, control interface 45 allows access to DSAU memory 66 for reading out the data stored therein, including the auxiliary information originating from AWG 3.

Hence, in more general terms, control interface 45 is adapted to program at least one of AWG 3, SU 30, DSAU 23 and OGU 5 and/or to read out DSAU memory 66 where DSAU 23 stores results.

Applications:

The present device can be used in a large number of applications, in particular for device testing and sample probing at high frequencies in science and engineering.

Figure 7:
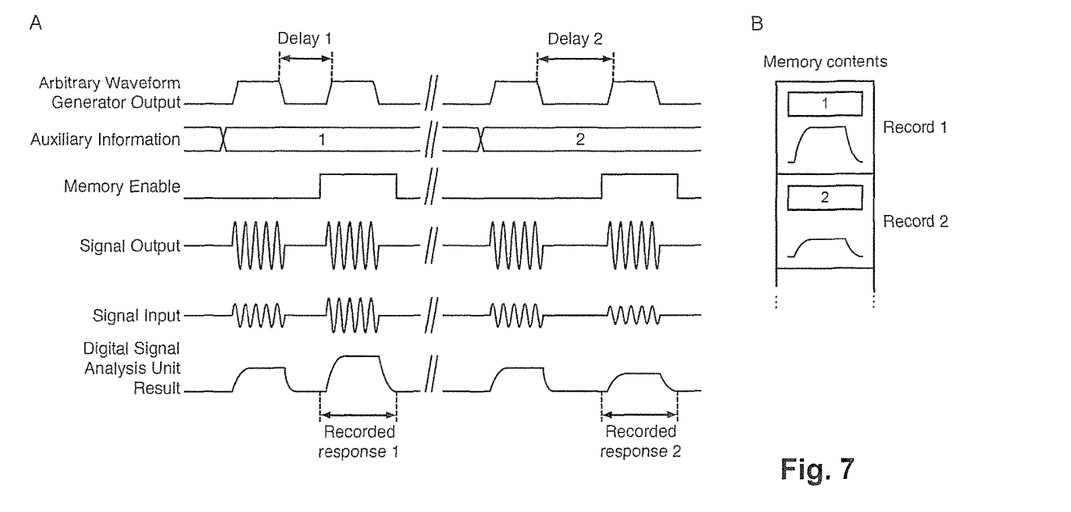
FIG. 7 is a timing diagram illustrating some advantages of the communication between the AWG and the DSAU.

FIG. 7 shows, under A, a timing diagram shown for a measurement that consists of a sequence of smaller measurements. In many scientific experiments, it is of interest to the researcher to vary the value of a controlled parameter between experiments. In the shown example, the parameter to be varied is selected as the delay between the two pulses generated by AWG 3 and marked as Delay 1 and Delay 2 in the figure. A common problem when using discrete instruments for such a measurement is to determine the relationship between the AWG signal output and the corresponding measurement results. In the present example, the information is generated by sequencer 52 of AWG 3 on information output 56 and received by DSAU 23 on information input 67. The information is stored together with the signal analysis results as auxiliary information in DSAU memory 66.

As can be seen from the figure, AWG 3 generates pulses that control the envelope of the signal output of the device (first line of FIG. 7, which shows the AWG output before processing by OGU 5). These pulses are multiplied in OGU 5 with the sine or cosine value of NCO 40, i.e. the signal at output 9 is a modulated version of the NCO waveform.

In addition, sequencer 52 of AWG 3 may also communicate the enable signal for storage enable input 70 controlling the storage of data in DSAU memory 66, which can be used to control specifically which of the signal analysis results should be stored.

The figure also shows an example of the signal input after the signal output has passed through the UUT. The "digital signal analysis unit result" illustrates one possible result generated by DSAU 23 in the form of the magnitude of the complex result generated as a function of the demodulation computation outlined above.

Under B, FIG. 7 shows examples of the corresponding records that will be stored in DSAU memory 66 for later retrieval by the user. As can be seen from the figure, the DSAU memory 66 will not only store the results of the signal analysis operation, but also the auxiliary information provided by sequencer 52, which can be used to identify the specific experiments, and, thereby, the particular delay value that was used for generating the stimulus signal of the UUT.

As illustrated by the above discussion, the integration of AWG 3 and DSAU 23 within the same instrument enables a plurality of information to be passed between the two processes in a manner that is highly synchronous with the signal generation and analysis process. The information can be used for controlling specifically when to store signal analysis results, as well as for tagging said results in order to simplify further analysis made by the user.

Figure 8:
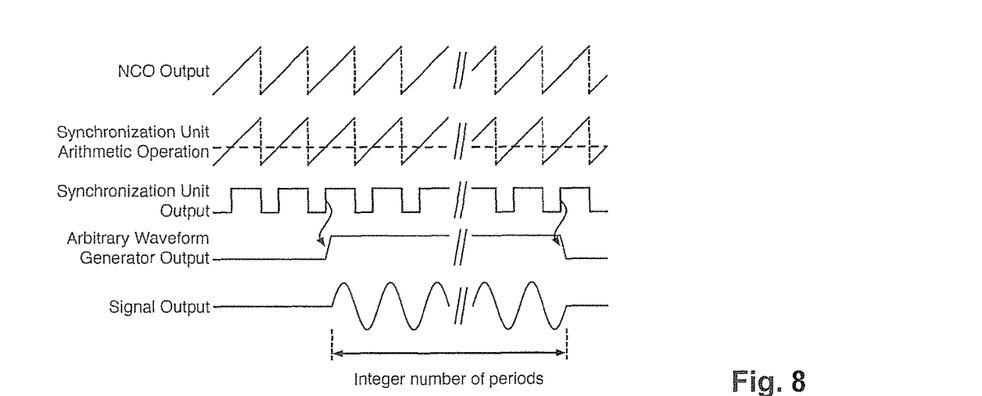
FIG. 8 is a timing diagram illustrating some advantages of the communication between the DSAU and AWG facilitated by the SU.

FIG. 8 shows a timing diagram that illustrates the communication from DSAU 23 to AWG 3 by means of SU 30. In this particular example, NCO 40 is configured with a specific frequency that defines the period of the resulting triangular waveform generated by said NCO. The NCO output is connected to SU 30. In one possible embodiment, SU 30 is configured to compare the signal of NCO 40 to a user configurable threshold, and to generate a Boolean value when the signal is above said threshold. The resulting Boolean value is illustrated as the "synchronization unit output" signal, which is in turn fed to sequencer 52 of AWG 3, where it can be used for various purposes. In this particular example, sequencer 52 is configured to use the signal in order to precisely define the point in time when it should start generating an output signal. As can be seen from the figure, AWG 3 starts to generate an output signal at a point in time where the sinusoid signal of the DSAU precisely crosses zero. Similarly, at the end of the sequence, sequencer 52 can disable the output waveform in a precisely defined manner in relation to the signal of NCO 40, such that the resulting signal output ends at zero and glitches are avoided.

Figure 9:
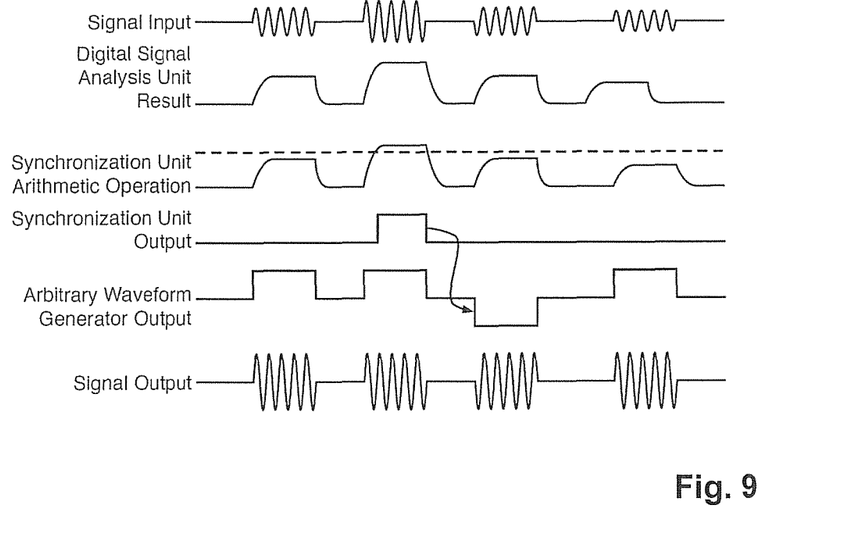
FIG. 9 is a timing diagram illustrating some possibilities of dynamic waveform selection in the AWG based on results computed by the DSAU and SU.

FIG. 9 shows a timing diagram that further illustrates how AWG 3 may dynamically select between different waveforms to output as a function of a result computed by DSAU 23. In the example, the device receives an input signal, which gives rise to a "digital signal analysis unit result" from DSAU 23. SU 30 applies a threshold to said result and generates a logic output signal corresponding to whether the result is above (1) or below (0) the threshold. Sequencer 52 of AWG 3 periodically samples the output signal of SU 30 and dynamically selects the next waveform to output. Here, the output waveform is either a positive pulse, in case a logic 0 was detected, or a negative waveform, in case a logic 1 was detected.

As illustrated above, the precise synchronization between DSAU 23 and/or NCO 40 and AWG 3 as mediated by SU 30 enables AWG 3 to be synchronized to the signals from NCO 40 and/or DSAU 23. In turn, this enables AWG 3 to control the signal output of the device in such a way that the resulting signal may be generated without glitches. In addition, AWG 3 can control the signal output such that an integer number of periods of the signal from NCO 40 is generated.

A further advantage is that NCO 40 will continue to run as long as the device is turned on, thereby maintaining synchronicity with any processes that may be running in UUT 11.

An application in which the present device provides unique advantages in comparison to existing solutions involves a closed-loop system, where a physical phenomenon in UUT 11 gives rise to a periodic signal with a varying frequency. Examples of such systems include mechanical oscillators, which exhibit a resonance frequency, as well as pulsed laser systems that drive an optical experiment at a certain repetition rate. In these examples, it is of interest to adjust the frequency of the signal generated by AWG 3 and applied to UUT 11 such that the resonance condition is maintained, or the pulse repetition rate is stabilized. Such applications are made possible by the present device. The DSAU measures the response of UUT 11 and adjusts the frequency of NCO 40 accordingly. AWG 3 in turn provides the necessary application specific shaping of the excitation signal, such that, for example, the resonance condition of the entire closed-loop system is maintained.

In another application, the combination of AWG 3 and DSAU 23 is used for compensating nonlinear behavior in UUT 11. UUT 11 is stimulated by a periodic signal generated by AWG 3. The precise shape of the generated signal is adjusted so as to minimize the spectral effects of the non-linearities in UUT 11. However, as the parameters needed for such an adjustment are often not known a priori, and may change during the cause of an experiment, DSAU 23 can be used to measure the effect of the non-linearities. This can also be done in a closed-loop fashion. DSAU 23 measures the non-linearities in real-time and then controls the amplitude, phase, frequency or another property of the signal generated by AWG 3, so as to achieve the best possible suppression of said effects. The physical phenomena of interest of UUT 11 can now be measured at much higher precision thanks to the suppression of the disturbing effects.

Notes:

Conventional setups rely on separated instruments for generating electric signals for the devices to be tested and for analyzing the corresponding results. Such experimental setups lack a high quality and deterministic synchronization. In particular in the analysis of small structures and small timescales, e.g. in the field of nanotechnologies, there is a need for a highly precise synchronization of signal generation and signal acquisition in order to optimize the quality of the results and to enable experiments with higher sensitivity.

In typical laboratories, discrete instruments are synchronized using trigger lines, which can carry only a single bit of information on each line. The amount of information that can be transmitted between the instruments is, therefore, highly limited. Furthermore, discrete trigger lines carry an inherent timing uncertainty deriving from various sources, which are often unknown or not under the control of the user.

The SU of the present device allows timing critical information to be passed between the AWG and SU in a user configurable manner. In addition, the output of the instrument itself is generated by an output generation unit (OGU). The essence of the OGU is that it enables the arithmetic combination of signals from the AWG and DSAU in order to generate the signal output of the instrument.

The synchronization unit is central to the solution because:

It permits deterministic timing relation between signal generation and signal acquisition It permits exchange of timing information between signal generation and signal acquisition Information derived from the signal acquisition can be used to tailor the signal generation Information and signals generated for signal acquisitions can be used for the signal generation, e.g. timing The signal generation is enabled to provide configuration information to the signal acquisition in real-time The signal generation is enabled to mark measurements effectively in real-time (tagging of analysis results)

The AWG itself is illustrated in more detail using the block diagram of FIG. 5. As can be seen from the figure, the sequencer of the AWG is extended in comparison to the prior art by new connections to the SU as well as to the DSAU. The connections to the SU can be used for synchronizing specifically when the AWG should start generating new signals, but could also be used in a more dynamic fashion in order for the sequencer to select which among a set of waveforms to play as a function of the input from the SU.

In many practical situations the solution described in the embodiments above provide a better implementation for closed-loop operations. Closed-loop is required in adaptive situations where stimulus and measurement need to be adapted on short timescales, always changing, always regulated by the action of the synchronization unit.

An advantage of the present device is that hardware resources can be shared among the different processing units. This saves costs and simplifies the interconnection between the units. Generally, reducing the number of different instruments in an experimental setup reduces the setup complexity. This not only saves hardware costs, but also reduces the costs for engineering. In addition, the signal-to-noise ratio can be significantly improved by reduced setup complexity and intrinsically synchronized instrumentation.

A further advantage of the presented device is that the problem of synchronizing multiple individual instruments for signal generation and analysis is solved by the combination of the functionality of said instruments into a single device. The combination of the instruments allows connecting the signal generation and signal analysis via a sophisticated synchronization unit SU instead of just using single-bit trigger lines. As a consequence, the AWG and DSAU can work in highly synchronized manner, and additional important information can be exchanged and saved to memory. This is advantageous in complex scientific experiments, where the experimenter must control one or more parameters in synchronous fashion in relation to the signal analysis process.

While there are shown and described presently preferred embodiments of the invention, it is to be distinctly understood that the invention is not limited thereto but may be otherwise variously embodied and practiced within the scope of the following claims.

The invention claimed is:

1. A device for generating a probe signal and for analyzing a response signal to said probe signal, the device comprising:
an arbitrary waveform generator AWG having at least one signal output, wherein said AWG is responsive to AWG control signals and adapted to generate a probe signal depending on said AWG control signals,
a digital signal analysis unit DSAU having a signal input for receiving said response signal, wherein said DSAU is responsive to DSAU control signals and adapted to analyze said response signal and to generate measured data therefrom, and
a reconfigurable synchronization unit SU receiving in real-time, AWG state information from said AWG and DSAU state information from said DSAU and having a programmable configuration,
wherein said SU is adapted to generate, in real-time, said AWG control signals and said DSAU control signals as a function of said AWG state information, said DSAU state information and said programmable configuration, and
further comprising at least one common numerical oscillator for said AWG and said DSAU.

2. The device of claim 1, further comprising:
a common system clock generator that is configured to synchronously clock said AWG, said DSAU, said SU and said common numerical oscillator,
wherein said AWG, said DSAU, said SU, and said numerical oscillator are synchronous circuits and clocked by said common system clock generator.

3. The device of claim 1, wherein at least said AWG, DSAU and SU are FPGA or ASIC circuits.

4. The device of claim 1, wherein said AWG, said DSAU and said SU are arranged in a common housing.

5. The device of claim 1, wherein said AWG comprises at least one information output for sending configured to send single-bit or multi-bit information values to said DSAU, and
wherein said DSAU is adapted and structured to store said information values with said measured data, and
wherein said DSAU comprises a programmable sequencer adapted to programmatically set a value at said information output.

6. The device of claim 1, wherein said AWG comprises a programmable sequencer adapted to define a waveform to be generated,
wherein said sequencer is programmable in conditional manner as a function of said AWG control signals.

7. The device of claim 1, wherein said AWG comprises a programmable sequencer adapted to programmatically set a synchronization output for said AWG state information to be sent to said SU.

8. The device of claim 1, wherein said DSAU is adapted to process the response signal with an algorithm parameterized by the DSAU control signals that the DSAU receives from said SU.

9. The device of claim 1, wherein said DSAU implements at least one of the following functionalities: lock-in amplification, boxcar averaging, PID control, spectrum analysis, phase-locked loop, digitization, digital filtering, convolution, correlation.

10. The device of claim 1, wherein said DSAU comprises a synchronization output configured to send at least some of the measured data as DSAU state information to said SU.

11. The device of claim 1, wherein said DSAU comprises a DSAU memory for storing at least part of said measured data together with information received from said AWG and/or said SU.

12. The device of claim 1, further comprising a control interface adapted to at least one of:
program at least one of said AWG, said SU, said DSAU and generation unit OGU for digitally post-processing a signal generated in said AWG, and
read out a DSAU memory where said DSAU stores at least some of said measured data.

13. The device of claim 1, further comprising a common system clock generator that synchronously clocks said AWG, said DSAU and said SU.

14. The device of claim 13, wherein said AWG, said DSAU and said SU are synchronous circuits clocked by said common system clock generator.

15. The device of claim 1, wherein said SU is adapted to generate the AWG and DSAU control signals from the AWG state information and the DSAU state information in programmable manner.

16. The device of claim 15, wherein said SU is configured to generate the control signals from the AWG state information and the DSAU state information by programmatically applying at least several of the following operations: arithmetic operations, logical operations, time shifting operations, threshold comparisons.

17. The device of claim 1, further comprising an output generation unit OGU for digitally post-processing a signal generated in said AWG,
wherein said OGU is programmable to optionally combine the signal generated in said AWG with at least one further value using a plurality of different operations.

18. The device of claim 17, wherein said further value is a signal from said DSAU.

19. The device of claim 17, further comprising a common system clock generator that is configured to synchronously clock said AWG, said DSAU and said SU,
wherein said AWG, said DSAU, said SU, and said OGU are synchronous circuits clocked by said common system clock generator.

20. A device for generating a probe signal and for analyzing a response signal to said probe signal, the device comprising:
an arbitrary waveform generator AWG having at least one signal output, wherein said AWG is responsive to AWG control signals and adapted to generate a probe signal depending on said AWG control signals,
a digital signal analysis unit DSAU having a signal input for receiving said response signal, wherein said DSAU is responsive to DSAU control signals and adapted to analyze said response signal and to generate measured data therefrom, and
a reconfigurable synchronization unit SU receiving in real-time, AWG state information from said AWG and DSAU state information from said DSAU and having a programmable configuration,
wherein said SU is adapted to generate, in real-time, said AWG control signals and said DSAU control signals as a function of said AWG state information, said DSAU state information and said programmable configuration;
further comprising an output generation unit OGU for digitally post-processing a signal generated in said AWG,
wherein said OGU is programmable to optionally combine the signal generated in said AWG with at least one further value using a plurality of different operations and
further comprising at least one common numerical oscillator for said AWG and said DSAU,
wherein said further value is a signal from said numerical oscillator.

21. The device of claim 20, wherein said OGU is programmable to multiply the signal generated in said AWG with the further value or to add the signal generated in said AWG to the further value.

* * * * *